(12) United States Patent
Koops et al.

(10) Patent No.: US 9,017,561 B2
(45) Date of Patent: Apr. 28, 2015

(54) PIEZO-RESISTIVE MEMS RESONATOR

(71) Applicant: NXP B. V., Eindhoven (NL)

(72) Inventors: Gerhard Koops, Aalst (BE); Jozef Thomas Martinus van Beek, Rosmalen (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/012,209

(22) Filed: Aug. 28, 2013

(65) Prior Publication Data

US 2014/0001147 A1 Jan. 2, 2014

Related U.S. Application Data

(62) Division of application No. 12/977,769, filed on Dec. 23, 2010, now Pat. No. 8,569,934.

(30) Foreign Application Priority Data

Dec. 23, 2009 (EP) ..................................... 09180585

(51) Int. Cl.
| | |
|---|---|
| C23F 1/00 | (2006.01) |
| H01L 21/302 | (2006.01) |
| H01L 41/332 | (2013.01) |
| H03H 3/007 | (2006.01) |
| H03H 9/02 | (2006.01) |

(52) U.S. Cl.
CPC ........... *H01L 41/332* (2013.01); *H03H 3/0072* (2013.01); *H03H 9/02259* (2013.01); *Y10S 977/762* (2013.01)

(58) Field of Classification Search
CPC ............... H01L 41/332; H03H 3/0072; H03H 9/02259; H03B 5/30
USPC ......... 216/2, 41, 58, 83, 99; 438/706; 977/762
See application file for complete search history.

(56) References Cited

U.S. PATENT DOCUMENTS

| | | | | |
|---|---|---|---|---|
| 5,521,884 A | * | 5/1996 | Humphries et al. | 367/140 |
| 6,681,063 B1 | | 1/2004 | Kane et al. | |
| 2007/0105321 A1 | * | 5/2007 | Lee et al. | 438/270 |
| 2007/0259471 A1 | | 11/2007 | Li et al. | |
| 2008/0314148 A1 | | 12/2008 | Robert | |
| 2010/0026421 A1 | * | 2/2010 | Beek et al. | 333/219.1 |

OTHER PUBLICATIONS

Liu, J., et al. "Fabrication of Silicon Nanowires," Applied Physics A; Material Science & Processing, vol. A66, No. 5, pp. 539-541 (May 1998).
Toriyama, T., et al. "Piezoresistance Measurement on Single Crystal Silicon Nanowires," J. of Applied Physics, vol. 93, No. 1, pp. 561-565 (Jan. 1, 2003).
Husain, A. et al. "Nanowire-Based Very-High-Frequency Electromechanical Resonator," Applied Physics Letters, vol. 83, No. 6, pp. 1240-1242 (Aug. 11, 2003).
Fung, W. et al. "A Nanowire-Based Very-High-Frequency Electromechanical Resonator," SSEL Annual Report, 1 pg. (2007).

(Continued)

*Primary Examiner* — Shamim Ahmed

(57) ABSTRACT

A piezo-resistive MEMS resonator comprising an anchor, a resonator mounted on the anchor, an actuator mounted to apply an electrostatic force on the resonator and a piezo-resistive read-out means comprising a nanowire coupled to the resonator.

13 Claims, 3 Drawing Sheets

(56) References Cited

OTHER PUBLICATIONS

Arellano, N. "Silicon Nanowire Coupled Micro-Resonators," IEEE MEMS 2008, pp. 721-724 (Jan. 2008).
Schewe, P. "Giant Piezoresistance," Physics News Update, No. 863, No. 1 (May 1, 2008).
Singh, N. et al. "Fully Gate-All-Around Silicon Nanowire CMOS Devices," Solid State Technology (May 2008).
He, R., et al. "Self-Transducing Silicon Nanowire Electromechanical Systems at Room Temperature," Nano Letters, vol. 8, No. 6, pp. 1756-1761 (2008).
Barlian, A., et al. "Review: Semiconductor Piezoresistance for Microsystems," Proc. of the IEEE, vol. 97, No. 3, pp. 513-552 (Mar. 2009).
Bui, T., et al. "Characterization of the Piezoresistive Effect and Temperature Coefficient of Resistance in Single Crystalline Silicon Nanowires," IEEE Micro-Nanomechatronics and Human Science, pp. 462-466 (Nov. 9, 2009).
Pennelli, G. et al. "Top Down Fabrication of Long Silicon Nanowire Devices by Means of Lateral Oxidation," Microelectronic Engineering, vol. 86, No. 11, pp. 2139-2143 (2009).
Yong Zhu, et al.; "Nanoscale Displacement and Strain Measurement"; Proceedings fo the 2003 SEM Annual Conference and Exposition on Experimental and Applied Mechanics; Session 77, Paper 155; Jun. 2-4, Charlote, North Carolina, US (2003).
He, R., et al.; "Giant Piezoresistive Effect in Silicon Nanowires"; Nature Nanotechnology 1; pp. 42-46 (2006).
Van Beek, et al.; "Scalable 1.1 GHz Fundamental Mode Piezo-resistive Silicon MEMS Resonator"; IEDM 2007, pp. 411-414.
Thanh, Tung; "Characterization of the Piezoresistive Effect and Temperature Coefficient of Resistance in Single Crystalline Silicon Nanowires"; pp. 462-466 (Nov. 9, 2009).
Extended European Search Report for European Patent Appln. No. 09180585.3 (Jul. 20, 2010).

\* cited by examiner

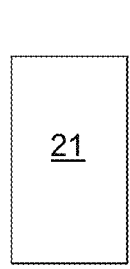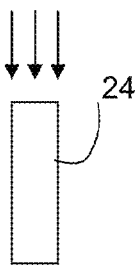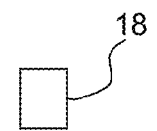
FIG 5a      FIG 5b      FIG 5c      FIG 5d
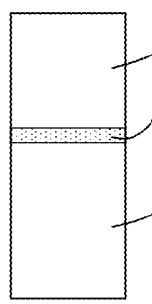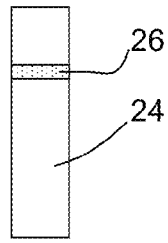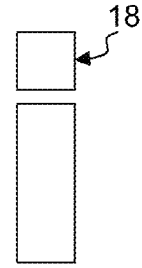
FIG 6a      FIG 6b      FIG 6c      FIG 6d

PIEZO-RESISTIVE MEMS RESONATOR

This application is a divisional of U.S. patent application Ser. No. 12/977,769, filed Dec. 23, 2010, issued U.S. Pat. No. 8,569,934, which is a claims the priority under 35 U.S.C. §119 of European patent application no. 09180585.3, filed on Dec. 23, 2009.

FIELD OF THE INVENTION

This invention relates to micro-electromechanical systems (MEMS). More particularly, it relates to piezo-resistive MEMS resonator devices.

BACKGROUND OF THE INVENTION

MEMS resonators allow the integration of accurate timing and frequency reference devices on a silicon chip. This allows major cost and size reductions compared, for example, to conventional quartz oscillator circuits.

MEMS resonators can use extensional (longitudinal) modes, or torsional (bending) modes. Extensional modes are favourable in some applications because they can store more energy than most flexural modes, and are therefore less susceptible to non-linearity.

Extensional-mode—also known as planar-mode—vibration consists of a compression wave in the plane of the material. That is, the physical displacement of the material takes place in directions lying in the same plane as the resonator, alternately stretching and compressing the material. There is little or no displacement (that is, bending or flexion) in the direction transverse to the plane. Torsional mode vibration involves the bending of a structure out of its plane.

In a typical MEMS resonator, the mechanical vibration is excited by electrostatic forces resulting from an electrical signal applied via one or more electrodes spaced a small distance apart from the resonator. The vibration gives rise to a changing capacitance, which can be detected either via a separate output electrode (or electrodes) or via the body of the resonator itself.

In a capacitive read-out arrangement, in order to have a measurable signal, the change in capacitance during movement of the MEMS resonator needs to be large enough. This is usually achieved by making the MEMS structures high (using ~10 µm Silicon-on-Insulator (SOI) layers) and wide. It is therefore very hard to scale these devices down to smaller sizes (and higher frequencies) without decreasing the signal (the admittance) too much.

One method to overcome this disadvantage is to make use of a piezo-resistive read-out arrangement, as disclosed by J. T. M. van Beek et al, "Scalable 1.1 GHz fundamental mode piezo-resistive silicon MEMS resonator", IEDM 2007 pages 411-414. The read out method involves sending a small current through the resonating devices. The mechanical movement of the device will induce mechanical stretching which in turn will change the resistance of the current path (by the piezo-resistive effect) and register as an electrical signal.

When the input signal is at or near the resonant frequency of the device, resonance occurs, effectively amplifying the output signal at this frequency by the gain factor Q of the device.

The size of a MEMS resonator is inversely related to the resonant frequency. Current sizes are sufficiently small to make Radio-Frequency (RF) resonators realizable using this technology. This makes MEMS technology an exciting prospect for next generation wireless communication devices. However, to prove a viable alternative to conventional resonators, MEMS devices must match or exceed their performance. The devices must resonate in predictable and stable modes and be highly efficient transducers of electrical/mechanical energy.

One of the disadvantages of the piezo-resistive read-out method is that a small current is needed through the resistor in order to measure the change in resistance. The read out method therefore consumes electrical power.

SUMMARY OF THE INVENTION

According the invention there is provided a piezo-resistive MEMS resonator comprising an anchor, a resonator body mounted on the anchor, an actuator mounted to apply an electrostatic force on the resonator and a piezo-resistive read-out means comprising a nanowire coupled to the resonator, wherein the resonator body has an area of at least $100\,\mu m^2$ and the nanowire has a cross section of at most $10^{-14} m^2$.

This design combines a low power miniature piezo-resistive readout scheme with a large size resonator. A piezo-resistive effect is created that exceeds the piezo-resistive effect that is observed for bulk silicon.

In operation the MEMS resonator is excited by an electrostatic force and the mechanical motion of the resonator is detected using the piezo-resistive properties of silicon. The invention is based on the realisation that silicon nanowires show a giant piezo-resistive effect. This means that the change in resistance for a certain applied stress is much larger in silicon nanowires than in bulk silicon (about a factor 30). By using this effect in MEMS resonators the operating power is decreased and the transconductance is increased. The giant piezo-resistive effect is discussed by P. Schewe et al.: "Giant Piezoresistance", Physics News Update, May 2008.

It has been found that when scaling down the size of the readout path, the transconductance does not scale linearly with the wire diameter, but increases faster than would be expected simply from geometric considerations.

Preferably, the resonator body has an area of at least $200\,\mu m^2$ and more preferably at least $400\,\mu m^2$. The nanowire preferably has a cross section of at most $5\times 10^{-15} m^2$. In one example, the nanowire comprises a structure having a width of approximately 50 nm.

The resonator can be fabricated on a silicon-on-insulator (SOI) layer, and the nanowire is made by oxidizing and etching the SOI layer. Alternatively, the resonator can be fabricated on a silicon-on-insulator (SOI) layer and the nanowire can be made by growing a SiGe layer at a pre-selected place, growing a c-Si layer on the SiGe layer, oxidizing the SiGe layer and selectively etching the oxidized SiGe layer to form the nanowire.

The nanowire portion preferably comprises an isolated portion of the silicon layer. Thus, a small depth part of the relatively thick SOI layer is isolated to enable the desired small cross section nanowire to be formed.

The invention also provides a method of manufacturing a piezo-resistive MEMS resonator, comprising:

forming an anchor, a resonator body mounted on the anchor and a piezo-resistive read-out means on a silicon on insulator substrate; and providing an actuator for applying an electrostatic force on the resonator;

wherein the piezo-resistive read-out means comprises a nanowire coupled to the resonator, formed by etching and isolating a silicon portion from the silicon-on-insulator layer, and wherein the resonator body has an area of at least $100\,\mu m^2$ and the nanowire has a cross section of at most $10^{-14} m^2$.

By isolating a small depth portion of the silicon layer, a nanowire can be formed.

Etching the silicon portion can comprise:
etching a silicon line of first width;
oxidizing a portion of the silicon line and etching away the oxidized silicon to form a line of second, smaller width.

This creates a line of the desired width, using standard processes.

In one example, etching the silicon portion further comprises removing a top portion of the line of second width to define a nanowire portion as a remaining bottom portion. For example, removing a top portion can comprise implanting a species which amorphises a portion of the line of second width to a desired depth, and removing the amorphised part of the silicon line of second width.

In another example, etching the silicon portion further comprises providing an isolated top portion of the line of second width to define a nanowire portion. For example, a silicon germanium layer can be formed between a lower silicon portion and an upper silicon portion in the region of the nanowire portion, and the silicon germanium layer is removed to isolate the upper silicon portion.

In all examples, wherein the isolated portion preferably has a depth of less than 100 nm (e.g. 50 nm) and a line width of less than 100 nm.

BRIEF DESCRIPTION OF THE DRAWINGS

The present invention will now be described, by way of example, with reference to the accompanying drawings, wherein:

FIGS. 5a to 5d illustrate one method of forming a silicon nanowire for use in the MEMS resonator made in accordance with the present invention, and FIGS. 6a to 6d illustrate another method of forming a silicon nanowire for use in the MEMS resonator made in accordance with the present invention.

In the drawings the same reference numerals have been used to indicate corresponding features.

DETAILED DESCRIPTION OF EMBODIMENTS

The invention is based on the use of the giant piezo-resistive effect as the readout mechanism for a MEMS resonator. This enables a decrease in the operating power of the device.

Figure 1:
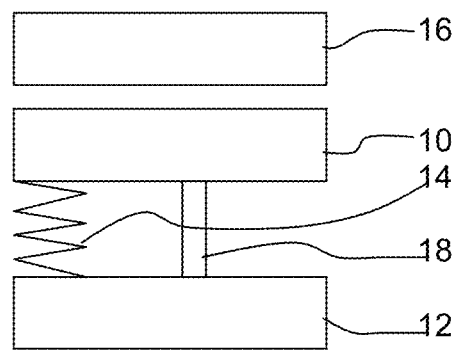
FIG. 1 is a diagrammatic view of a MEMS resonator made in accordance with the present invention.

FIG. 1 shows schematically the elements of the resonator of the invention. A silicon resonator mass 10 is resiliently mounted to an anchor 12 for example, by means of a spring 14. The resonator mass 10 is excited electrostatically by means of an actuation electrode 16.

A silicon nanowire 18 is connected between the resonator 10 and the anchor 12. As the resonator mass 10 vibrates, the nanowire 18 is subject to stress causing its electrical resistance to vary and a voltage difference between the resonator mass 10 and the anchor 12 will cause a current in the nanowire. Since this nanowire 18 shows a giant piezo-resistive effect, the read-out signal will be much larger compared to a bulk resistor. In this way the dissipating power for the resistor can be decreased in order to have the same output signal.

Figure 2:
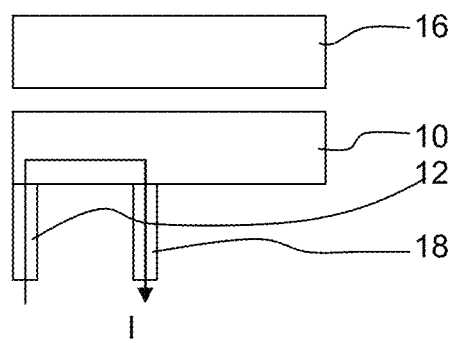
FIG. 2 is a top-down picture of a MEMS resonator made in accordance with the present invention.

FIG. 2 differs from the diagram shown in FIG. 1 by the resonator mass 10 being attached to the rest of the silicon (not shown) by means of the anchor 12, without the need for a separate spring element as in FIG. 1. The resonator mass 10 is also connected to another part of the silicon by the nanowire 18 in such a way that a current I can flow from the anchor 12 through the resonator mass 10 and through the nanowire 18. In this way the piezo-resistive effect can be measured and the movement of the resonator mass 10 can be monitored.

In the example illustrated in FIG. 2, the nanowire 18 can have a cross-section of 50×50 nm. However the giant piezo-resistive effect starts to be visible for 100×100 nm cross-sections.

The use of the giant piezo-resistive effect for readout of miniature resonator devices has been suggested.

This invention is based on the recognition that the nanowire readout is suitable for large resonator structures, for example with area greater than 100 μm$^2$.

Figure 3:
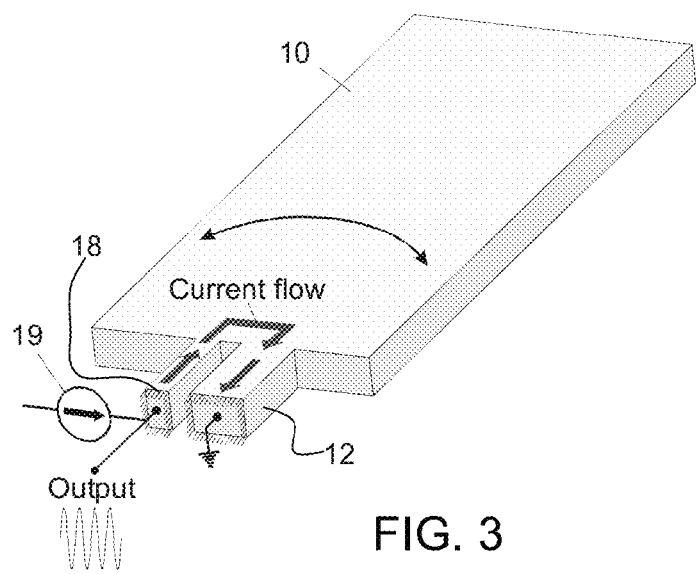
FIG. 3 shows the resonator of FIG. 2 in perspective view and in more detail.

FIG. 3 shows a perspective view of the resonator design of the invention corresponding to the design of FIG. 2. A dc current source 19 provides current to the nanowire 18 and this flows to earth through the anchor 12. The output voltage is measured at the nanowire as shown.

Figure 4:
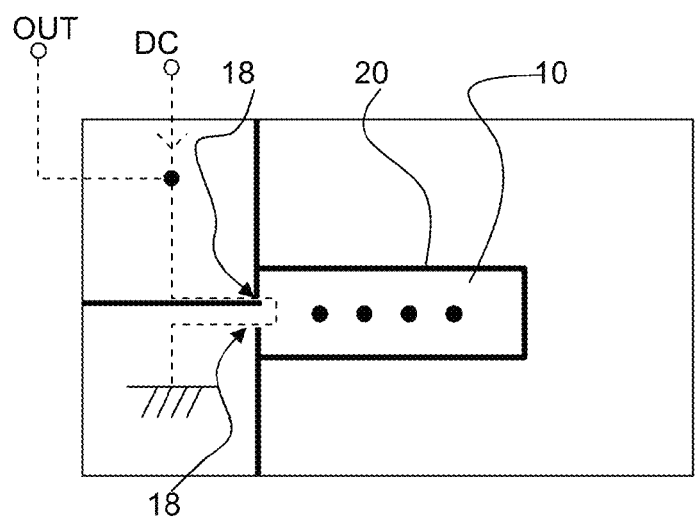
FIG. 4 shows the resonator of FIG. 3 in plan view.

FIG. 4 shows the patterning of the silicon layer (typically a silicon layer of a SOI substrate) to define the structure. The lines 20 represent removed material which provides an isolated resonator mass 10 suspended by a hinge defined by the anchor 12, and also defines the narrow opening which forms the nanowire.

FIG. 4 shows with dotted lines the current path and the output voltage used for readout.

The dimensions of the resonator body 10 in FIG. 4 are approximately 60 μm by 10 μm. Thus, the resonator body is substantially larger than the nanowire structure. This combines a resonator mass for which the resonance frequency can manufactured with high accuracy (because of good control over the dimensions) with good read out sensitivity using the giant piezo-resistive effect. Generally, the area of the resonator body is more than 100 (μm)$^2$. More preferably, the resonator body area is more than 200 (μm) and even more preferably more than 400 (μm)$^2$.

The nanowire has a cross section of at most $10^{-14}$m$^2$ (10,000 (nm)$^2$). It may be less than $5\times10^{-15}$m$^2$ (5,000 (nm)$^2$).

FIGS. 5 and 6 show two possible manufacturing methods for the nanowire structures. As shown in FIG. 4, the nanowire comprises an isolated area of silicon across which an electrical connection is made. The methods are shown are for forming an isolated small cross sectional area (e.g. 50 nm width× 50 nm depth) of silicon. As shown in FIG. 4, one end of the nanowire will be connected to the resonator mass and the other end will be connected to a readout pad. FIGS. 5 and 6 simply show the concepts used and show the cross section of the top silicon layer of the SOI substrate. The top silicon layer may be a few microns thick, and the etching lines in FIG. 4 are anisotropically etched through the silicon. The underlying oxide is isotropically etched in a subsequent step to release the resonator from the substrate (in conventional manner).

Referring to FIGS. 5a to 5d, in one example, the resonators are made on SOI wafers with a silicon thickness of 1.5 μm. The top silicon layer is shown. In order to make nanowires it is necessary to etch approximately 50 nm wide structures and to separate the top part (e.g. the top or bottom 50 nm) of that structure in order to form the nanowire.

FIG. 5a shows a silicon line 21 etched in the SOI layer. This has a width greater than the desired nanowire width, for example 100-300 nm. FIG. 5b shows the silicon line 21 being partially oxidized to form an oxide layer 22 enveloping a non-oxidized line 24 of the desired width. In FIG. 5c the oxide layer 22 is etched away using hydrofluoric acid (HF).

This creates a line of narrower width, and having the desired width for the nanowire (e.g. 50 nm).

The no-oxidized line 24 is then treated by implanting with a species that amorphises the silicon to a desired depth. In this way, the silicon is made amorphous apart from the bottom 50 nm (for example).

Finally FIG. 5d shows that the amorphised silicon is etched away selectively to the crystalline-Si using HF to leave a nanowire 18, in the form of a remaining portion of silicon.

FIGS. 6a to 6d show another method of making a nanowire. FIG. 6a shows a silicon line 21 in which a layer 26 of silicon germanium (SiGe) is epitaxially grown on top of the silicon, in those places where it is desired to have a nanowire. On top of the SiGe layer 26 a thin layer 27 (<50 nm) of crystalline Si is grown.

FIGS. 6b and 6c show the oxidation and etching processes which were in the embodiments shown in FIGS. 5b and 5c above. Thus, in FIG. 6c, the 50 nm wire comprises a silicon base, a SiGe layer and the nanowire portion of desired thickness on top.

Finally FIG. 6d shows the nanowire 18 after the SiGe layer 26 has been removed selectively to the silicon with a dry etch. Again, a nanowire portion 18 of the desired dimensions remains. Thus, SiGe can be used to define the isolation between the top nanowire portion 18 and the thicker (1.5 μm) silicon layer beneath.

The invention has particular, but not exclusive, application in timing devices for example in integrated circuits used in GSM phones, Bluetooth devices, RF-ID devices, Smartcards and clocks.

In the present specification and claims the word "a" or "an" preceding an element does not exclude the presence of a plurality of such elements. Further, the word "comprising" does not exclude the presence of other elements or steps than those listed.

The use of any reference signs placed between parentheses in the claims shall not be construed as limiting the scope of the claims.

From reading the present disclosure, other modifications will be apparent to persons skilled in the art. Such modifications may involve other features which are already known in the design, manufacture and use of MEMS resonators and component parts therefor and which may be used instead of or in addition to features already described herein.

The invention claimed is:

1. A method of manufacturing a piezo-resistive MEMS resonator, comprising:
   forming an anchor, a resonator body mounted on the anchor and a piezo-resistive read-out means on a silicon on insulator substrate; and
   providing an actuator for applying an electrostatic force to the resonator;
   wherein the piezo-resistive read-out means includes a nanowire coupled to the resonator, the nanowire being formed by etching and isolating a silicon portion from the silicon-on-insulator layer, and
   wherein the resonator body has an area of at least 100 μm$^2$ and the nanowire has a cross section of at most $10^{-14}$ m$^2$.

2. A method as in claim 1, wherein the etching of the silicon portion comprises:
   etching a silicon line of first width; and
   oxidizing a portion of the silicon line and etching away the oxidized silicon to form a line of second, smaller width relative to the first width.

3. A method as in claim 2, wherein the etching of the silicon portion further comprises removing a top portion of the line of second width to define a nanowire portion as a remaining bottom portion.

4. A method as in claim 3, wherein the removing of the top portion comprises implanting a species which amorphises a portion of the line of second width to a desired depth, and removing the amorphised part of the silicon line of second width.

5. A method as in claim 2, wherein etching the silicon portion further comprises providing an isolated top portion of the line of second width to define a nanowire portion.

6. A method as in claim 5, wherein the providing an isolated top portion comprises forming a silicon germanium layer between a lower silicon portion and an upper silicon portion in the region of the nanowire portion, and removing the silicon germanium layer to isolate the upper silicon portion.

7. A method as in claim 1, wherein the isolated portion has a depth of less than 100 nm and a line width of less than 100 nm.

8. A method as in claim 7, wherein the isolated portion has a depth of approximately 50 nm.

9. A method as in claim 1, wherein the etching of the silicon portion further comprises selectively removing silicon with a dry etch, and using a silicon germanium layer to isolate a top portion of the nanowire and the silicon-on-insulator layer beneath.

10. A method as in claim 1, wherein the etching of the silicon portion further comprises partially oxidizing a portion of the silicon-on-insulator layer, the oxidized portion enveloping a non-oxidized line approximately 50 nm in width, and etching away the oxide portion.

11. A method as in claim 1, wherein the nanowire has a cross section of at least 5000 nm$^2$.

12. A method as in claim 1, wherein the resonator body has an area of at least 400 μm$^2$.

13. A method as in claim 1, wherein the resonator body is suspended by a hinge defined by the anchor, the anchor further defining the nanowire.

* * * * *